(12) United States Patent
Hua et al.

(10) Patent No.: US 11,262,815 B2
(45) Date of Patent: Mar. 1, 2022

(54) HEAT SINK SYSTEM WITH BROAD COMPATIBILITY CAPACITY

(71) Applicant: HEWLETT PACKARD ENTERPRISE DEVELOPMENT LP, Houston, TX (US)

(72) Inventors: Chanh V. Hua, Houston, TX (US); Sunil Rao Ganta Papa Rao Bala, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/671,634

(22) Filed: Nov. 1, 2019

(65) Prior Publication Data
US 2021/0132670 A1    May 6, 2021

(51) Int. Cl.
G06F 1/20 (2006.01)
G06F 1/18 (2006.01)
H05K 7/20 (2006.01)

(52) U.S. Cl.
CPC ............... *G06F 1/20* (2013.01); *G06F 1/182* (2013.01); *H05K 7/2039* (2013.01)

(58) Field of Classification Search
CPC ......... H01L 23/4006; H01L 2023/4087; H01L 2224/404; H01L 23/4093; H01L 2023/4037; H01L 2023/4043; H01L 2023/405; H01L 2023/4056; H01L 2023/4068; H01L 2023/4062; H01L 2023/4081; H01L 2023/4075; H01L 23/40; H01L 24/00; H01L 24/72; H05K 2201/066; H05K 5/0069; H05K 7/20854; H05K 7/2039; H05K 1/0204; H05K 1/184; H05K 7/209; H05K 2201/10378; H05K 3/306; H05K 3/4697; H05K 5/0052; H05K 7/20436; H05K 7/205; H05K 2201/09063; H05K 2201/09072; H05K 2201/10303; H05K 2201/10393; H05K 2201/10409; H05K 2201/1053; H05K 2201/10568; H05K 2201/10598; H05K 2203/167; H05K 3/301; H05K 3/303; H05K 5/0047; H05K 7/1427; H05K 7/20409; H05K 1/0203; H05K 1/181; H05K 5/0217; H05K 5/04;
(Continued)

(56) References Cited

U.S. PATENT DOCUMENTS 5,133,403 A * 7/1992 Yokono ............... H01L 23/3733
165/185
5,705,850 A * 1/1998 Ashiwake ........... H01L 23/4338
257/706

(Continued)

*Primary Examiner* — Michael A Matey
(74) *Attorney, Agent, or Firm* — Hewlett Packard Enterprise Patent Department

(57) ABSTRACT

Systems, apparatuses, and methods described herein provide heat sinks that can be incorporated into chassis, yet be compatible with edge devices that contain many different combinations of hardware that can be arranged in many different ways on circuit boards. In one example, a pattern of fittings on an interior-facing side of the heat sink are configured to mate with fittings on a first side of an adapter pedestal. A second side of the adapter pedestal is configured to thermally couple with an electronic component housed within the chassis when the heat sink is fully seated and the pedestal is properly coupled to the heat sink.

20 Claims, 6 Drawing Sheets

(58) Field of Classification Search
CPC ........ H05K 7/14; H05K 7/1401; G06F 1/183;
G06F 1/20; F28F 2275/08; F28F
2275/085; F28F 2275/10; F28F 2275/16;
F28F 2275/20; F28F 2280/00; F28F
2280/06; F28F 2280/04; F28F 2280/02;
F28F 3/06; F28F 3/048; F28F 3/02
See application file for complete search history.

(56) References Cited

U.S. PATENT DOCUMENTS

| | | | | |
|---|---|---|---|---|
| 5,751,062 | A * | 5/1998 | Daikoku | H01L 23/4338 257/713 |
| 5,774,335 | A * | 6/1998 | Pare | H01L 23/4093 257/718 |
| 5,862,038 | A * | 1/1999 | Suzuki | H01L 23/4338 361/704 |
| 6,021,045 | A * | 2/2000 | Johnson | H01L 23/3677 165/185 |
| 6,256,202 | B1 * | 7/2001 | Murphy | H01L 23/4006 165/80.2 |
| 7,277,291 | B2 * | 10/2007 | Ross | H01L 23/4338 165/104.33 |
| 8,537,540 | B2 | 9/2013 | Landon | |
| 8,807,202 | B2 * | 8/2014 | Wang | H01L 23/4006 165/79 |
| 9,678,546 | B2 | 6/2017 | May et al. | |
| 9,867,317 | B1 * | 1/2018 | Jetton | H05K 7/209 |
| 2004/0020634 | A1 * | 2/2004 | Boudreaux | H01L 21/4882 165/104.33 |
| 2005/0088831 | A1 * | 4/2005 | Lin | H05K 7/209 361/752 |
| 2014/0035118 | A1 * | 2/2014 | Bayerer | H01L 23/36 257/690 |
| 2015/0327353 | A1 * | 11/2015 | Dickover | H01L 23/4338 361/679.54 |
| 2017/0231113 | A1 * | 8/2017 | Anderl | H01L 23/4006 |
| 2020/0152546 | A1 * | 5/2020 | Refai-Ahmed | H01L 23/367 |

* cited by examiner

HEAT SINK SYSTEM WITH BROAD COMPATIBILITY CAPACITY

BACKGROUND

Edge devices such as routers, switches, integrated access devices (IADs), and multiplexers generally serve as entry points for enterprise networks, service core provider networks, or other types of networks. An embedded computer system, such as a computer-on-module (COM) or another type of single-board computer (SBC), can be included in an edge device to provide desired processing capability and other types of functionality. COM Express® is an industry standard that defines standardized form factors and pin-outs for COMs, such as the mini form factor (84×55 mm), the compact form factor (95×95 mm) and the basic form factor (125×95 mm).

In Internet-of-Things (IoT) environments, sensors and other devices connected to a local network may produce large amounts of raw data. Transferring that raw data to a data center in the cloud may consume an inordinate amount of time and network bandwidth, thus causing noticeable latency. Edge devices can mitigate this problem by processing the raw data at the edge of the local network.

BRIEF DESCRIPTION OF THE DRAWINGS

Various features and advantages will become apparent from the following description, given by way of example only, which is made with reference to the accompanying drawings, of which.

DETAILED DESCRIPTION

Figure 1:
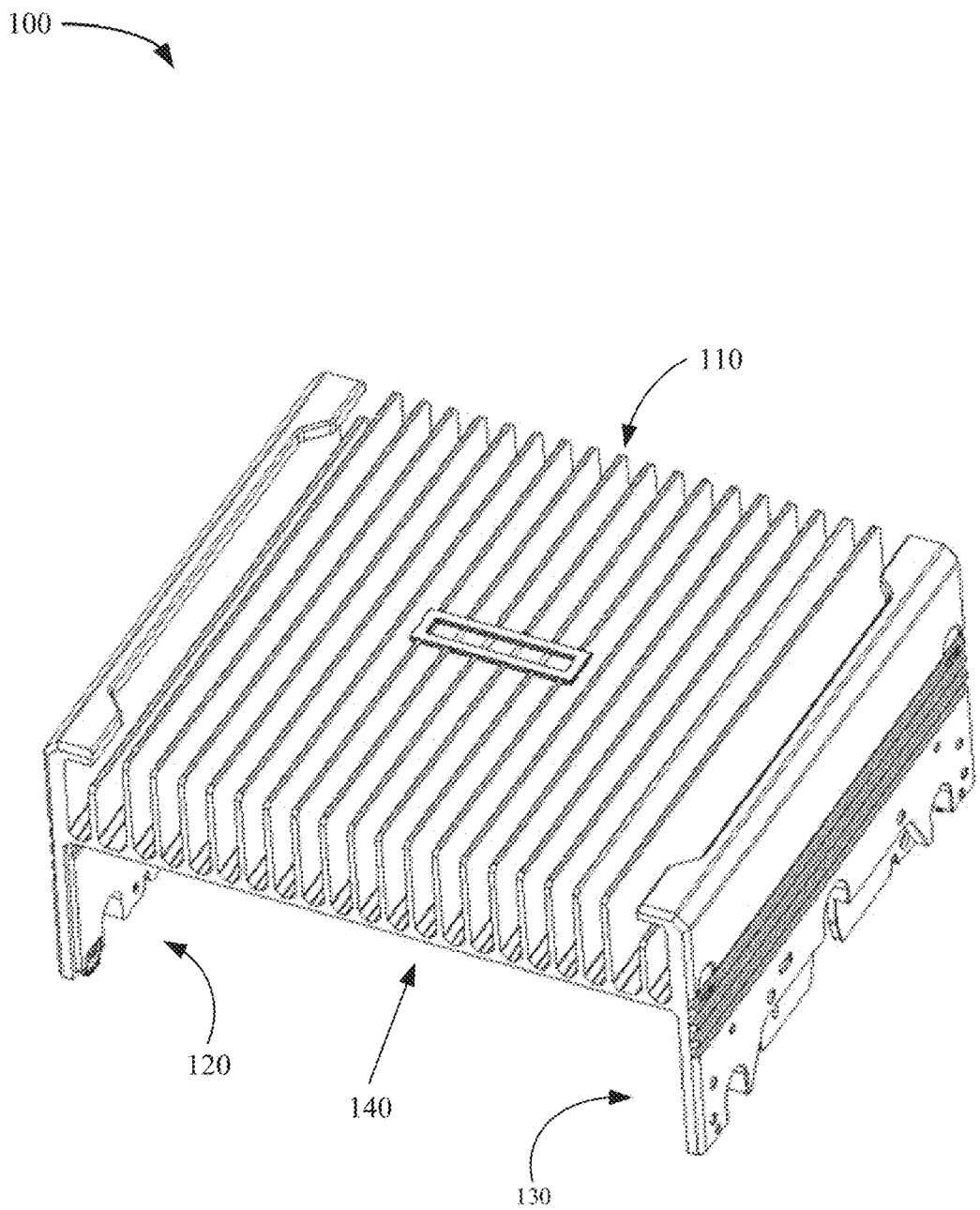
FIG. 1 is a first perspective view of a heat sink that can be used as a lid of a chassis for a computing device, according to one example.

With the advent of edge computing, computing systems designed to perform intensive processing are increasingly being deployed at the edge (e.g., at or near the physical location where endpoint devices reside) rather than in the large, dedicated datacenters that are often used to provide cloud computing services.

In a datacenter, environmental factors such as temperature and airflow can be carefully controlled via fan enclosures, air conditioners, heaters, and ventilation systems to ensure that the electronic components within the datacenter are not damaged or subject to accelerated wear-and-tear due to extreme temperatures, humidity, or other factors. However, edge devices that are not located in datacenters typically do not enjoy the environmental control benefits provided in datacenters. As a result, edge devices may be expected to function reliably in much harsher environments where ambient temperatures may range from −30 degrees Celsius to 70 degrees Celsius without the benefit of fan enclosures or other infrastructure that is typically included in datacenters to regulate ambient temperature. Furthermore, edge devices may be expected to satisfy relatively tight space constraints that often do not apply to hardware that is designed to fit into spacious datacenters. One way to make an edge device more compact and more robust to wide temperature fluctuations is to incorporate a heat sink into the chassis of the edge device such that fins of the heat sink are positioned along an exterior side of the chassis.

Edge devices may be employed for many different purposes in many different types of environments. As a result, many edge devices are specifically designed to perform very specific functions. Edge devices that are designed to perform different functions may have different types of processors. For example, while many edge devices include x86 processors, edge devices may also include field programmable gate arrays (FPGAs) or programmable logic controllers (PLCs). The type and number of processing elements used in any particular edge device are selected in accordance with the function the edge device is designed to perform, the applicable spatial constraints, and the temperature range in which the edge device is expected to operate. Other electronic components, such as memory (e.g., dual in-line memory modules (DIMMs)) and storage (e.g., non-volatile solid-state drives), may also be selected for inclusion in an edge device based on similar considerations.

Edge devices that include COMs that conform to industry-standards such as COM Express® may nonetheless differ widely depending on which electronic components are selected for inclusion therein. Thus, even though an edge device may include a circuit board that has standardized dimensions, the dimensions of other electronic components that are operably connected to the circuit board may vary widely from one edge device to another. This poses a challenge for vendors who seek to design a chassis that incorporates a heat sink. In order for the heat sink to cool an electronic component effectively, a part of the inner side of the heat sink typically has to extend far enough into the interior of the chassis to couple thermally to the electronic component (e.g., by contacting a thermal pad or a thin layer of thermal paste that is also in contact with the electronic component). Furthermore, the part of the heat sink that extends into the interior of the chassis has to extend towards the specific location of the electronic component to which the heat sink is to be thermally coupled. Since the location of the electronic component on the circuit board can vary and the dimensions (e.g., width, height, depth) of the electronic component can also vary from one edge device to another, the vendor may be obliged to design a different heat sink for each different type of edge device (or other device) that the vendor hopes to enclose in the chassis. The cost of designing project-specific heat sinks is likely to be high. Furthermore, if the vendor overestimates the number of edge devices of a specific type that customers will purchase, the heat sinks of unpurchased units of that type may not be repurposed easily.

The present disclosure describes solutions that address the problems described above. Systems, apparatuses, and methods described herein provide heat sinks that can be incorporated into chassis, yet be compatible with edge devices that contain many different combinations of hardware that can be arranged in many different ways on circuit boards. In one example, a pattern of fittings on an interior-facing side of the heat sink are configured to mate with fittings on a first side of an adapter pedestal. A second side of the adapter pedestal is configured to thermally couple with an electronic component housed within the chassis when the heat sink is fully seated and the pedestal is properly coupled to the heat sink. Adapter pedestals with different dimensions can be used to match with electronic components of different dimensions without requiring any change in the design of the heat sink itself. The adapter pedestal is attached to the heat sink without the use of welding, soldering, brazing, adhesives, or mechanical fasteners apart from the fittings.

FIG. 1 is a first perspective view of a heat sink 100 that can be used as a lid of a chassis for a computing device, according to one example. The heat sink 100 may be made of copper, aluminum, or some other solid material that is thermally conductive.

As shown, the heat sink 100 comprises fins 110. The fins 110 extend outward and increase the surface area of the heat sink 100. The fins are configured to be in contact with ambient air such that heat can dissipate rapidly through the surface area provided by the fins into the ambient air. As used herein, the term "fin" refers to any type of structure that extends outward from a base 140 of the heat sink 100 and is used to increase the surface area over which the heat sink 100 contacts air (or some other fluid). For example, elliptical fins, pin arrays, and other types of fins can all be used. Thus, while the fins 110 are shown as parallel thin plates, other types of fins may be used without departing from the spirit and scope of this disclosure.

The heat sink 100 also comprises flange 120 and flange 130. As shown, the flange 120 and the flange 130 may include grooves, apertures, and other features for securing the heat sink 100 to a chassis. In this example, the flange 120 and the flange 130 extend outward from the base 140 in planes that are orthogonal to a plane in which the base 140 lies.

Figure 2:
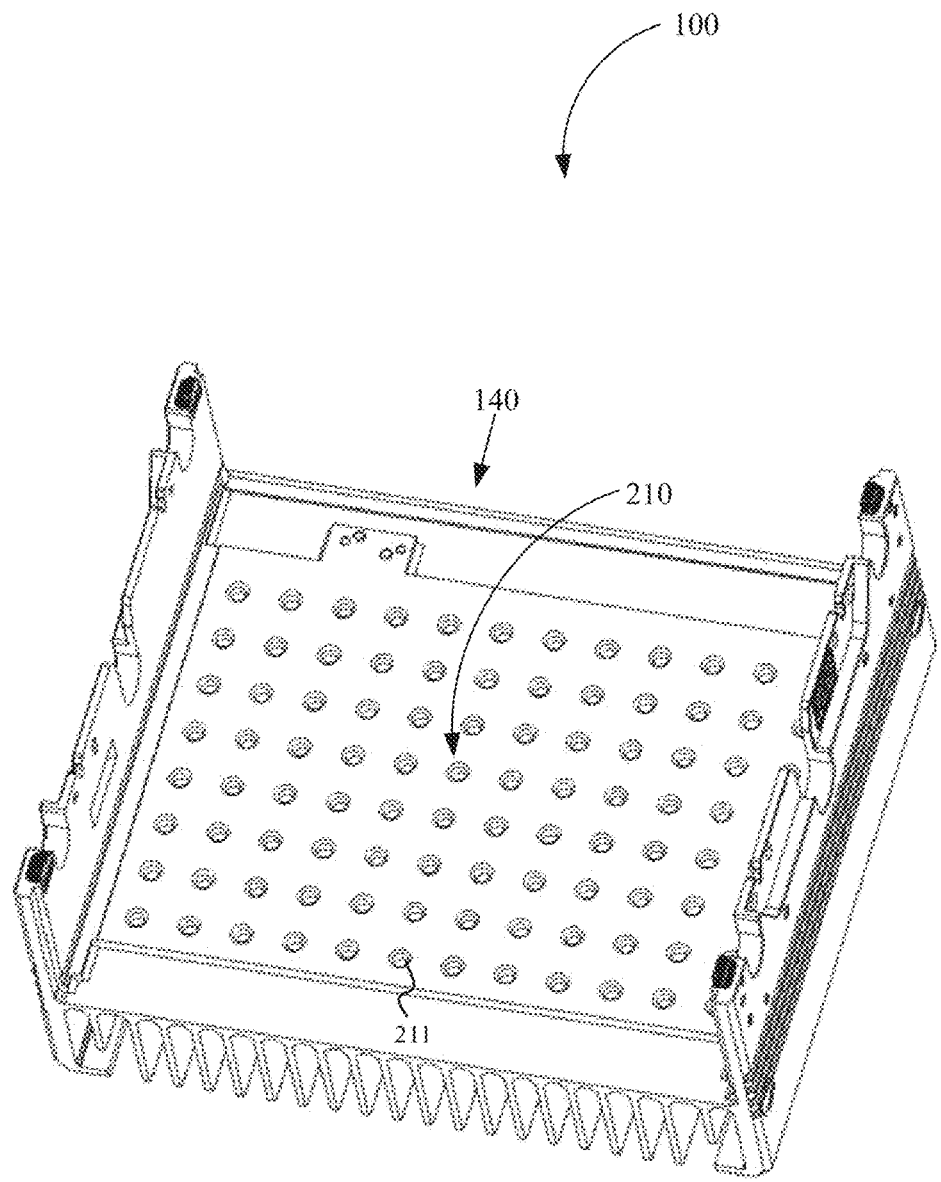
FIG. 2 is a second perspective view of the heat sink that can be used as a lid of a chassis for a computing device, according to one example.

FIG. 2 is a second perspective view of the heat sink 100 that can be used as a lid of a chassis for a computing device, according to one example. The side of the heat sink 100 that is shown in FIG. 2 is configured to face the interior of a chassis when the heat sink 100 is fully seated on the chassis.

As shown, the heat sink 100 comprises a plurality of fittings 210 arranged in a pattern (e.g., a regular grid) along the plane in which the base 140 lies. In this example, the fittings 210 are shown as sockets with circular cross-sections, such as socket 211. However, in other examples, other types of fittings, such as pins, may be used. As used herein, the term "fitting" may refer to any type of indentation that is configured to have a protrusion inserted therein or any type of protrusion that is configured to be inserted into an indentation in order to couple two physical objects together.

Figure 3:
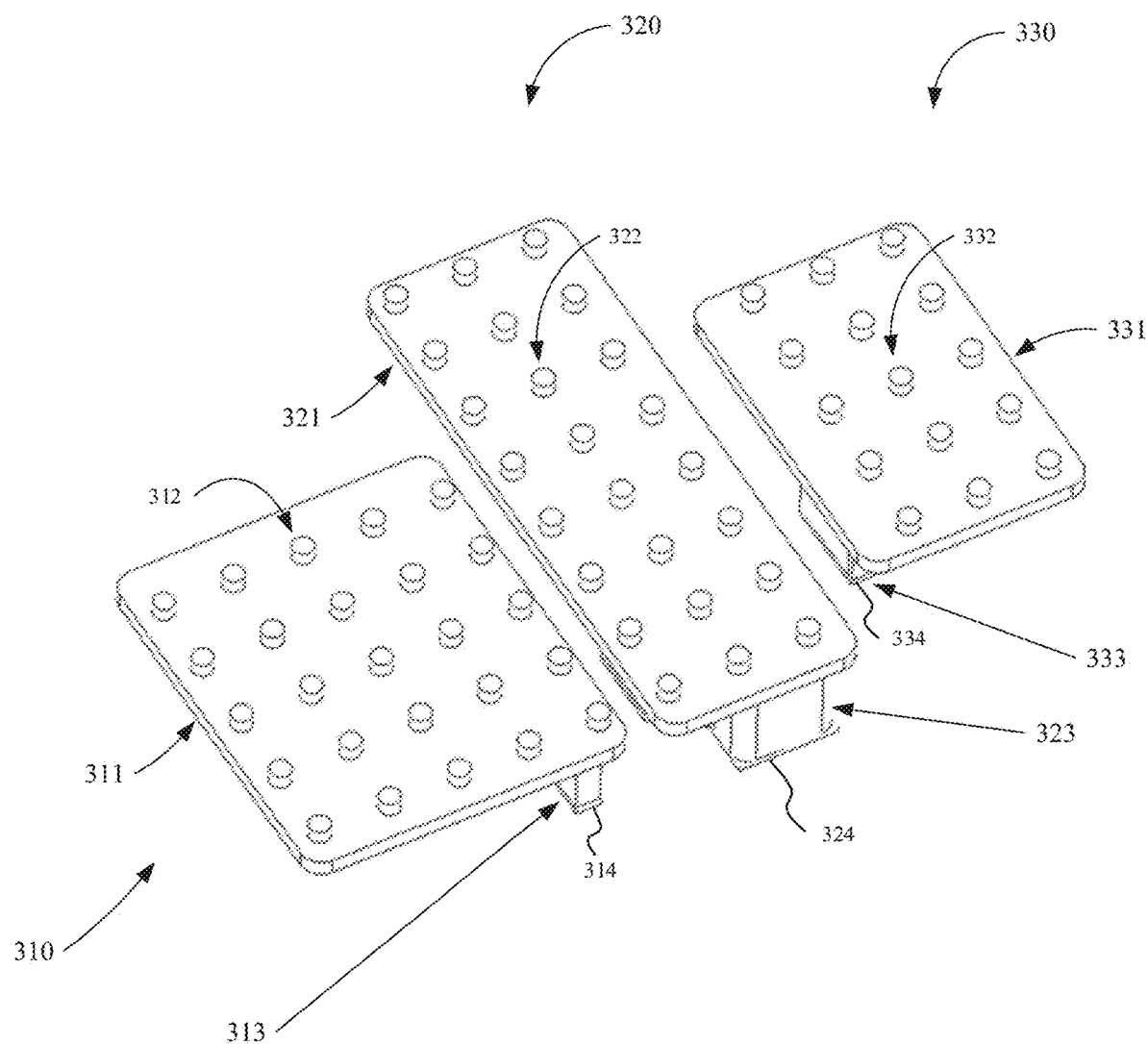
FIG. 3 is a perspective view of three example adapter pedestals that can be can be used to couple the heat sink to electronic components, according to one example.

The fittings 210 serve as a mechanism whereby the heat sink 100 can be coupled to one or more adapter pedestals (e.g., as shown in FIG. 3). When fully seated, an adapter pedestal can thermally couple the heat sink 100 to an electronic component located in a chassis for which the heat sink 100 serves as a lid. In addition, any of the fittings 210 that are not used to couple the heat sink 100 to an adapter pedestal may serve to increase the surface area of the heat sink 100 through which heat can dissipate (albeit into the interior of the chassis rather than the exterior).

FIG. 3 is a perspective view of three example adapter pedestals that can be can be used to couple the heat sink 100 to electronic components, according to one example. The sides of the adapter pedestals shown in FIG. 3 are configured to be coupled to the side of the heat sink that is shown in FIG. 2.

As shown, the adapter pedestal 310 includes a base 311 and a plurality of fittings 312 arranged in a pattern along a plane in which the base 311 lies. In this example, the fittings 312 are pins that are configured to mate with the fittings 210 that are shown in FIG. 2. In addition, the adapter pedestal 310 includes an extension portion 313 that extends outward from the plane in which the base 311 lies from the side of the base that is opposite the side on which the fittings 312 are located. The distal end 314 of the extension portion 313 is configured to be thermally coupled to at least one electronic component (e.g., via thermal paste or a thermal pad). For example, the distal end 314 may be flat and smooth surface.

Similarly, the adapter pedestal 320 includes a base 321 and a plurality of fittings 322 arranged in a pattern along a plane in which the base 321 lies. Again, in this example, the fittings 322 are pins that are configured to mate with the fittings 210 that are shown in FIG. 2. In addition, the adapter pedestal 320 includes an extension portion 323 that extends outward from the plane in which the base 321 lies from the side of the base that is opposite the side on which the fittings 322 are located. The distal end 324 of the extension portion 323 is configured to be thermally coupled to at least one electronic component (e.g., via thermal paste or a thermal pad).

Similarly, the adapter pedestal 330 includes a base 331 and a plurality of fittings 332 arranged in a pattern along a plane in which the base 331 lies. Again, in this example, the fittings 332 are pins that are configured to mate with the fittings 210 that are shown in FIG. 2. In addition, the adapter pedestal 330 includes an extension portion 333 that extends outward from the plane in which the base 331 lies from the side of the base that is opposite the side on which the fittings 332 are located. The distal end 334 of the extension portion 333 is configured to be thermally coupled to at least one electronic component (e.g., via thermal paste or a thermal pad).

Although the base 311, the base 321, and the base 331 are shown as rectangular prisms (of varying widths and lengths) with rounded corners in FIG. 3, many other shapes of varying dimensions may be used as bases for adapter pedestals. For example, while the bases 311, 321, 331 are rectangular prisms, bases that are L-shaped, C-shaped, J-shaped, X-shaped, or some other extruded shape may be used for adapter pedestals. The bases of an adapter pedestal may also have more or less fittings than those shown on bases 311, 321, 331 as long as the fittings are arranged in a pattern such that each pin will mate with one of the fittings 210 on the base 140 when the adapter pedestal is fully seated against the base 140 of the heat sink 100 shown in FIG. 2. Thus, the number of fittings on the base of an adapter pedestal is generally less than the number of fittings on the base of a heat sink with which the adapter pedestal is configured to mate. Also, in general, the base of an adapter pedestal has to fit within a chassis for which the heat sink serves as a lid when the heat sink is fully seated upon the chassis. Therefore, the perimeter of the base of the adapter pedestal generally has to fit within the perimeter of the base of the heat sink in at least one orientation.

Similarly, the dimensions of the extension portion(s) of an adapter pedestal may also vary depending on the size of an electronic component(s) with which the adapter pedestal is configured to be thermally coupled.

The fittings 210 on shown on the heat sink 100 (as shown in FIG. 2) are arranged such that the adapter pedestals 310, 320, 330 can be attached to the heat sink 100 at a plurality of different mounting locations by mating the fittings 312, 322, 332 with different subsets of the fittings 210 corresponding respectively to the different mounting locations. In some examples, the fittings 210 may include one or more keying features configured to restrict which adapter pedestals can be installed in which of the mounting locations or to restrict orientations of the adapter pedestals 310, 320, 330 when attached to the heat sink.

Figure 4:
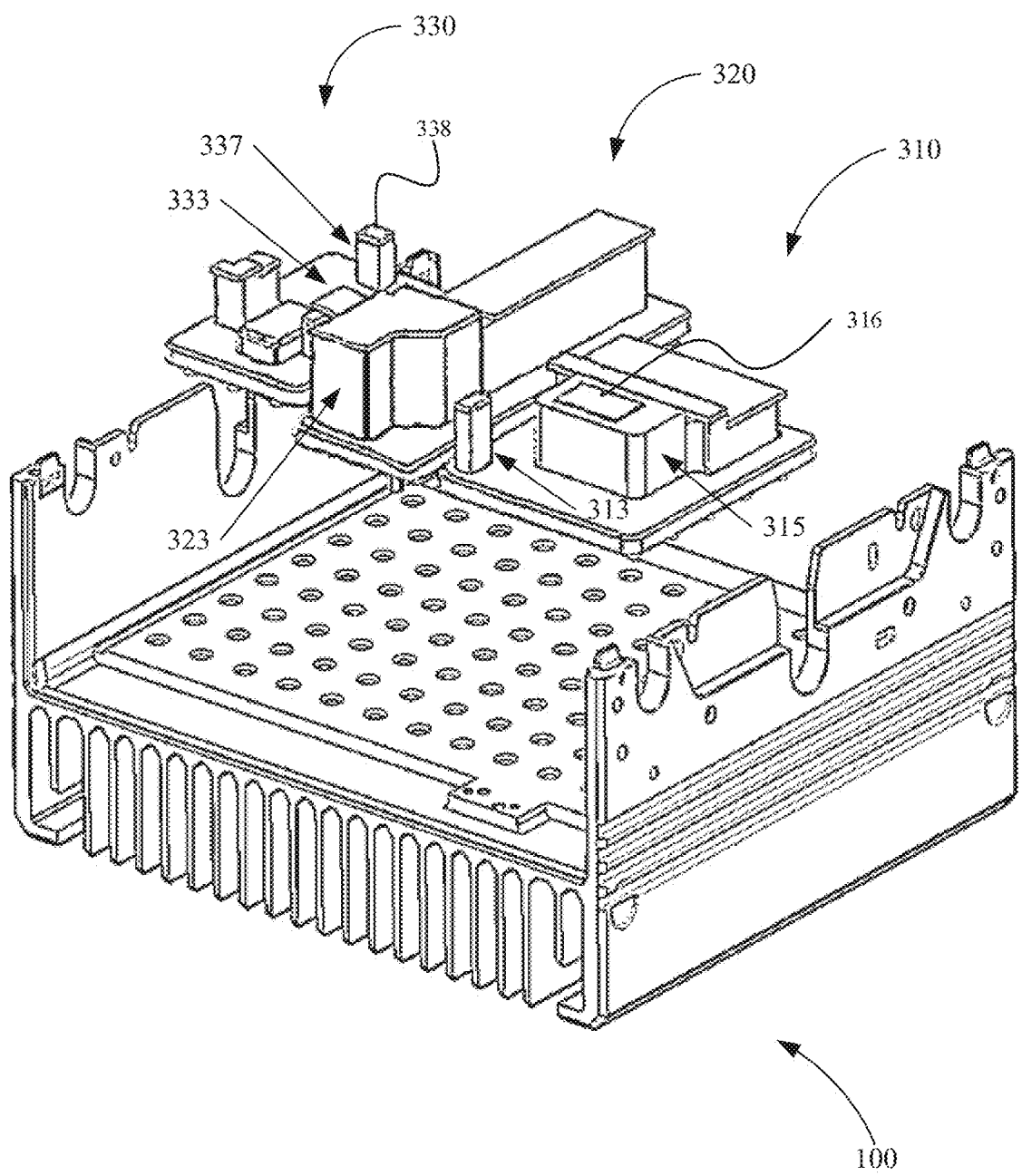
FIG. 4 provides a perspective view of the adapter pedestals positioned above the heat sink, according to one example.

FIG. 4 provides a perspective view of the adapter pedestals 310, 320, 330 positioned above the heat sink 100, according to one example. The side of the heat sink 100 that is shown in FIG. 4 is configured to face the interior of a chassis when the heat sink 100 is fully seated on the chassis. Similarly, the sides of the adapter pedestals 310, 320, 330 shown in FIG. 4 are configured to be thermally coupled to electronic components located within a chassis for which the heat sink 100 serves as a lid.

From the perspective shown in FIG. 4, the additional extension portion 315 of the adapter pedestal 310 is visible. The distal end 316 of the extension portion 315 is configured to be thermally coupled to at least one electronic component (e.g., via thermal paste or a thermal pad). Similarly, the distal end 338 of the additional extension portion 337 is also configured to be thermally coupled to at least one electronic component (e.g., via thermal paste or a thermal pad).

As shown, the shapes and dimensions of the extension portions 313, 323, 333, 315, 337 vary. Extension portions of many other shapes and dimensions can be custom fitted to couple the heat sink 100 to electronic components housed in a chassis for which the heat sink 100 serves as a lid. However, the heat sink 100 does not have to be customized or reshaped regardless of which electronic components are found in the chassis or how those components are arranged, mounted, or oriented. For any particular set of components and arrangement of those components, adapter pedestals can be customized without requiring any change to the heat sink 100.

Figure 5:
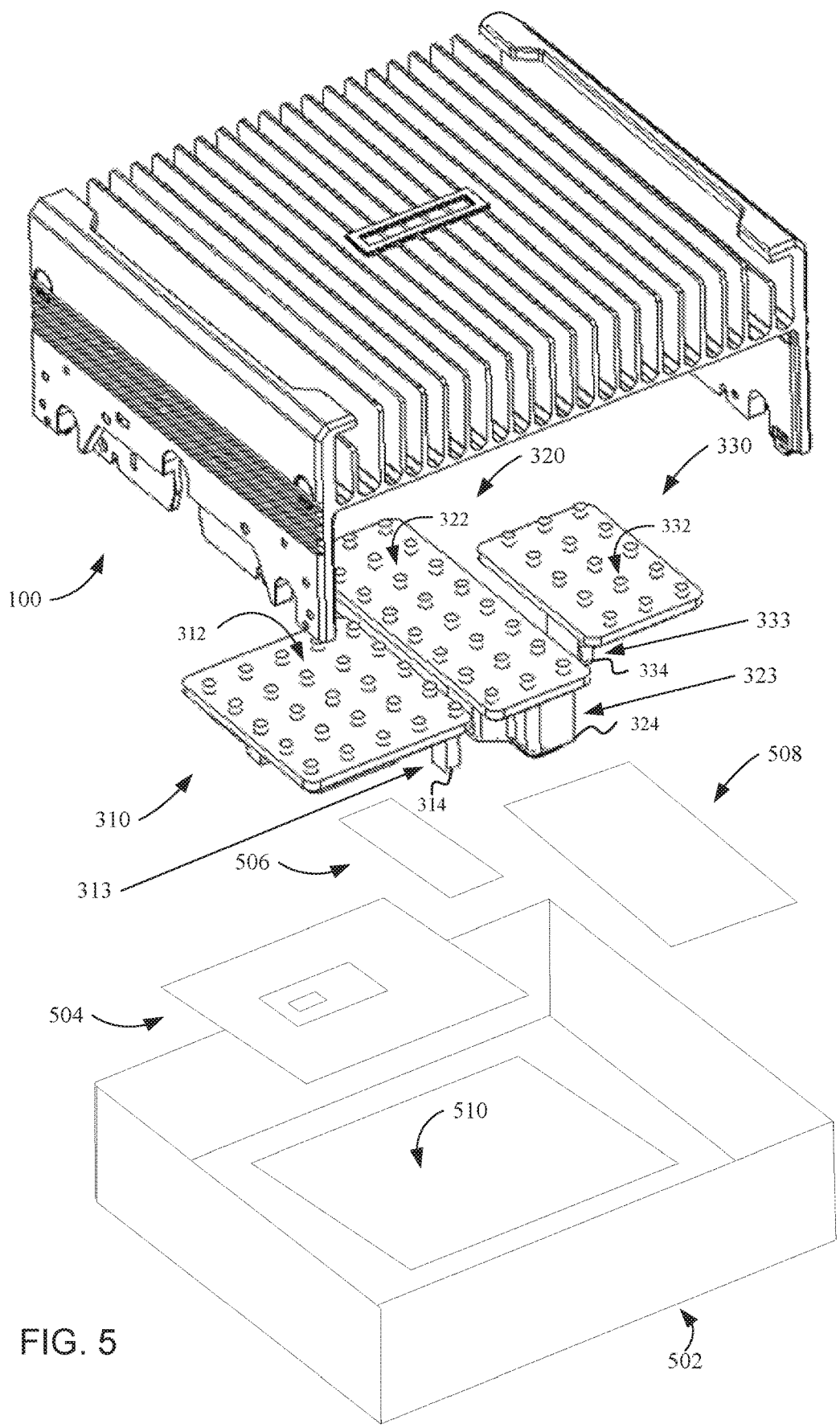
FIG. 5 illustrates an exploded perspective view of the heat sink, the adapter pedestals, the chassis, and electrical components, according to one example.

FIG. 5 illustrates an exploded perspective view of the heat sink 100; the adapter pedestals 310, 320, 330; the chassis 502; and electrical components 504, 506, 508, according to one example. The electrical component 504 may be a computer-on-module (COM). The electrical component 506 may be a solid-state drive (SSD) or a dual in-line memory module (DIMM), while the electrical component 508 may be a controller area network (CAN) bus card or some other type of card.

The motherboard 510 is shown in a fully seated position within the chassis 502. When the electrical components 504, 506, 508 are fully seated on the motherboard 510, the adapter pedestals 310, 320, 330 can be coupled to the heat sink 100 via the fittings 312, 322, 332 (respectively). Next, the heat sink 100 can be seated upon the chassis 502. When the heat sink is fully seated, a thin layer of thermal paste thermally couples the distal ends 314, 324, 334 to the electrical components 504, 506, 508.

The heat sink 100 and the adapter pedestals 310, 320, 330 are formed from at least one thermally conductive material. While the heat sink 100 and the adapter pedestals 310, 320, 330 may be formed from the same thermally conductive material, it may be advantageous for the heat sink 100 to be formed from a harder material than the adapter pedestals 310, 320, 330 because the exterior-facing side of the heat sink 100 may be exposed to rough handling which could deform the fins 110 if a softer material is used. By contrast, the adapter pedestals 310, 320, 330 will be completely contained within the interior of a chassis and do not have thin fins that could be easily deformed. As a result, the adapter pedestals 310, 320, 330 can be made of a softer material that has a higher thermal conductivity that the hard material of which the heat sink 100 is made. In one example, the adapter pedestals 310, 320, 330 are formed from copper and the heat sink 100 is formed from aluminum.

Figure 6:
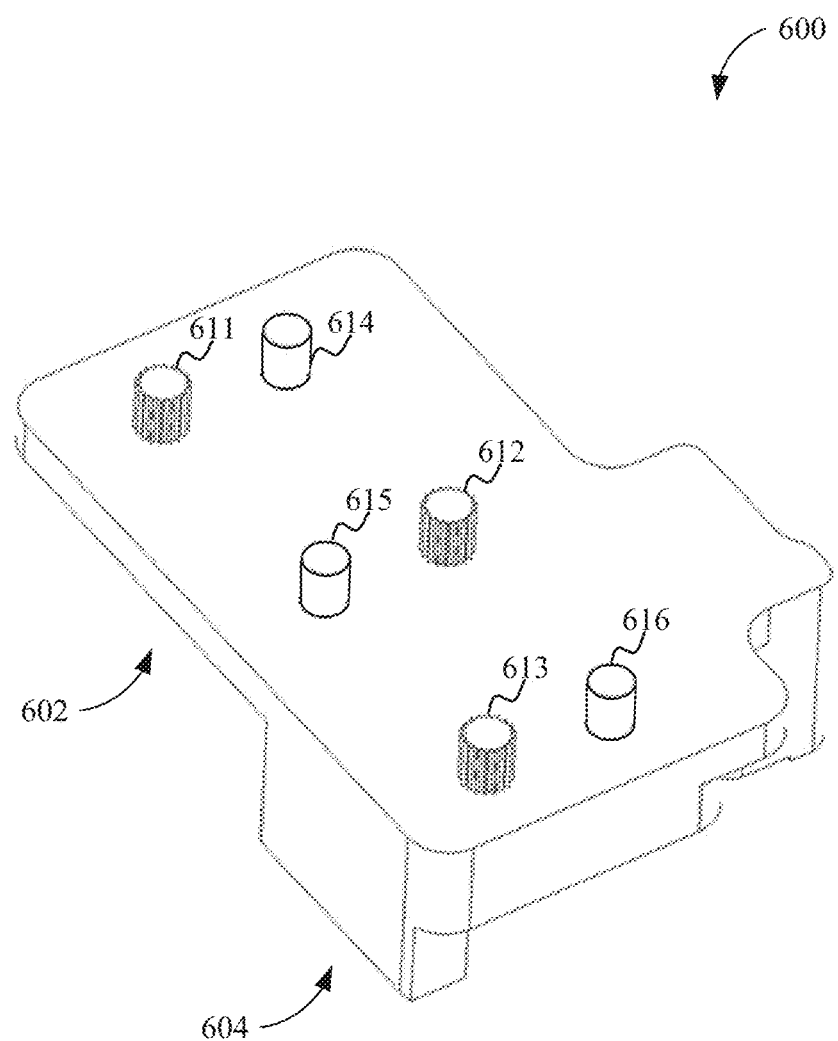
FIG. 6 illustrates an additional example of an adapter pedestal, according to one example.

FIG. 6 illustrates an additional example of an adapter pedestal, according to one example. As shown, the adapter pedestal 600 includes a base 602, an extension portion 604, and fittings 611-616.

Different types of fittings can be used on the adapter pedestal 600. For example, as shown, the circumferential sides of the fittings 611-613 are knurled with grooves that extend in an axial direction. The fittings 610 can be configured to press fit into the fittings 210 of the heat sink 100 (shown above in FIG. 2) to increase the surface area over which the adapter pedestal 600 contacts the heat sink 100. In other words, the fittings 611-613 may mate with the fittings 210 via an interference fit.

By contrast, the circumferential sides of the fittings 614-616 are smooth. The fittings 614-616 may have a tight fit or a clearance fit with the fittings 210. If a clearance fit is used, a thermal paste may optionally be used to fill in the clearance space between the fittings 614-616 and the fittings 210 to facilitate efficient thermal coupling between the adapter pedestal 600 and the heat sink 100.

While the present systems and apparatuses may be susceptible to various modifications and alternative forms, the embodiments discussed above have been provided only as examples. It is to be understood that the techniques are not intended to be limited to the particular examples disclosed herein. Indeed, the present techniques include all alternatives, modifications, and equivalents falling within the true spirit and scope of the appended claims.

Examples

The following additional examples are included below to highlight several aspects of the systems, apparatuses, and methods described herein. However, the scope of the disclosure is not limited to these additional examples or the other examples described herein.

Example 1 includes a system, comprising: an electronic component; a chassis to house the electronic component; a heat sink comprising a base, fins extending from a top side of the base, and a plurality of first fittings on an interior-facing side of the base, wherein the heat sink forms a lid of the chassis; and an adapter pedestal to thermally couple the electronic component to the heat sink, the adapter pedestal including a plurality of second fittings configured to attach the adapter pedestal to the heat sink by mating with the first fittings.

Example 2 includes the system of example 1, wherein the first fittings include sockets and the second fittings include pins.

Example 3 includes the system of example 1, wherein the first fittings include pins and the second fittings include sockets.

Example 4 includes the system of example 1, 2, or 3, wherein one or more of the second fittings are configured to have an interference fit with the first fittings.

Example 5 includes the system of example 1, 2, 3, or 4, wherein one or more of the second fittings are configured to have a clearance fit or a tight fit with the first fittings.

Example 6 includes the system of example 1, 2, 3, 4, or 5, further comprising: a second electronic component; and a second adapter pedestal to thermally couple the second electronic component to the heat sink, the second adapter pedestal including a plurality of third fittings configured to attach the second adapter pedestal to the heat sink by mating with the first fittings.

Example 7 includes the system of example 1, 2, 3, 4, 5, or 6, wherein the first fittings are arranged such that the adapter pedestal can be attached to the heat sink at a plurality of different mounting locations by mating the second fittings with different subsets of the first fittings corresponding respectively to the different mounting locations.

Example 8 includes the system of example 7, wherein the first fittings include one or more keying features configured to restrict which adapter pedestals, including the adapter pedestal, can be installed in which of the mounting locations or to restrict orientations of the adapter pedestals when attached to the heat sink.

Example 9 includes the system of example 1, 2, 3, 4, 5, 6, 7, or 8, wherein the first fittings are arranged on the interior-facing side of the base in a regular grid.

Example 10 includes the system of example 1, 2, 3, 4, 5, 6, 7, 8, or 9, wherein the heat sink is formed from a first thermally conductive material, and the adapter pedestal is formed from a second thermally conductive material.

Example 11 includes the system of example 10, wherein the first thermally conductive material is harder than the second thermally conductive material, and the second thermally conductive material has a higher thermal conductivity than the first thermally conductive material.

Example 12 includes the system of example 10, wherein the first thermally conductive material is aluminum and the second thermally conductive material is copper.

Example 13 includes the system of example 1, 2, 3, 4, 5, 6, 7, 8, 9, 10, 11, or 12, wherein the adapter pedestal is attached to the heat sink without the use of welding, soldering, brazing, adhesives, or mechanical fasteners apart from the first and second fittings.

Example 14 includes a method comprising: providing the system of example 1; attaching the adapter pedestal to the heat sink by mating the second fittings with a subset of the first fittings; thermally coupling the adapter pedestal, which is attached to the heat sink, with the electronic component.

Example 15 includes the method of example 14, further comprising: assembling the chassis by attaching the heat sink to a second part of the chassis.

Example 16 includes the method of example 14 or 15, comprising: attaching a second adapter pedestal to the heat sink by mating third fittings of the second adapter pedestal with a second subset of the first fittings; and thermally coupling the second adapter pedestal with a second electronic component housed within the chassis.

Example 17 includes method comprising: providing the system of example 1, with the adapter pedestal attached to the heat sink via the second fittings mating with a subset of the first fittings; and removing the adapter pedestal from the heat sink by decoupling the second fittings from the first fittings.

Example 18 includes the method of example 17, comprising: reattaching the adapter pedestal to the heat sink at a different mounting location by mating the second fittings with a second subset of the first fittings.

Example 19 includes the method of example 18, comprising: attaching a second adapter pedestal to the heat sink by mating third fittings of the second adapter pedestal with the first fittings.

Example 20 includes a method comprising: providing the system of example 1, with the adapter pedestal attached to the heat sink via the second fittings mating with a subset of the first fittings; attaching a second adapter pedestal to the heat sink by mating third fittings of the second adapter pedestal with a second subset of the first fittings; and thermally coupling the second adapter pedestal with a second electronic component housed within the chassis.

What is claimed is:

1. A system, comprising:
    a plurality of electronic components internal to the system, the plurality of electronic components including a first electronic component and a second electronic component that have different dimensions from each other;
    a chassis defining an external surface of the system, the chassis including a lid that is exposed to ambient air at an ambient temperature external to the system;
    a heat sink incorporated into the lid of the chassis and comprising:
        a base forming an interior-facing side of the lid,
        fins extending from an exterior-facing side of the lid, the fins exposed to the ambient air, and
        a plurality of a first type of fittings on the interior-facing side;
    a first adapter pedestal having first dimensions to form a first thermal coupling between the first electronic component and the heatsink of the lid;
    a second adapter pedestal having dimensions different from the first adapter pedestal to form a second thermal connection between the second electronic component and the heatsink of the lid; and
    wherein the first adapter pedestal and the second adapter pedestal include a plurality of a second type of fittings configured to attach each respective adapter pedestal to the heat sink by mating with the plurality of the first type of fittings, and
    wherein the plurality of electronic components are internal to the chassis and the heat sink provides cooling to each respective electronic component via exposure of the fins to the ambient air and an associated thermally coupled adapter pedestal.

2. The system of claim 1,
    wherein the plurality of the first type of fittings include sockets and the plurality of the second type of fittings include pins.

3. The system of claim 1,
    wherein the plurality of the first type of fittings include pins and the plurality of the second type of fittings include sockets.

4. The system of claim 1,
    wherein one or more of the plurality of the second type of fittings is configured to have an interference fit with the plurality of the first type of fittings.

5. The system of claim 4,
    wherein one or more of the plurality of the second type of fittings is configured to have a clearance fit or a tight fit with respective ones of the first type of fittings.

6. The system of claim 1, further comprising:
    a third electronic component from the plurality of electronic components; and
    a third adapter pedestal thermally coupling the third electronic component to the heat sink, the third adapter pedestal including a plurality of third the second type of fittings configured to attach the third adapter pedestal to the heat sink by mating with the plurality of first type of fittings,
    wherein:
        the third electronic components has a different shape than either of the first electronic component or the second electronic component, and the third adapter pedestal has a different shape than either of the first adapter pedestal or the second adapter pedestal.

7. The system of claim 1,
wherein the plurality of the first type of fittings are arranged such that a respective adapter pedestal can be attached to the heat sink at a plurality of different mounting locations by mating the plurality of the second type of fittings with different subsets of the plurality of the first type of fittings corresponding respectively to the different mounting locations.

8. The system of claim 7,
wherein the plurality of the first type of fittings include one or more keying features configured to restrict which of the respective adapter pedestals, including the first adapter pedestal, can be installed in which of the mounting locations or to restrict orientations of respective adapter pedestals when attached to the heat sink.

9. The system of claim 1,
wherein the plurality of the first type of fittings are arranged on an interior-facing side of the base in a regular grid.

10. The system of claim 1,
wherein the heat sink is formed from a first thermally conductive material, and the adapter pedestal is formed from a second thermally conductive material.

11. The system of claim 10,
wherein the first thermally conductive material is harder than the second thermally conductive material, and
the second thermally conductive material has a higher thermal conductivity than the first thermally conductive material.

12. The system of claim 10,
wherein the first thermally conductive material is aluminum and the second thermally conductive material is copper.

13. The system of claim 1,
wherein the first adapter pedestal is attached to the heat sink without the use of welding, soldering, brazing, adhesives, or mechanical fasteners apart from the pluralities of the first and second type of fittings.

14. A method comprising:
providing the system of claim 1;
attaching the first adapter pedestal to the heat sink by mating the plurality of the second type of fittings with a subset of the plurality of the first type of fittings;
thermally coupling the first adapter pedestal, which is attached to the heat sink, with the first electronic component.

15. The method of claim 14, comprising:
assembling the chassis by attaching the lid incorporating the heat sink to a second body part of the chassis.

16. The method of claim 14, comprising:
attaching the second adapter pedestal to the heat sink by mating third the plurality of the second type of fittings of the second adapter pedestal with a second subset of the plurality of the first type of fittings; and
thermally coupling the second adapter pedestal with the second electronic component within the chassis.

17. A method comprising:
providing the system of claim 1, with the first adapter pedestal attached to the heat sink via the plurality of the second type of fittings mating with a subset of the plurality of the first type of fittings; and
removing the first adapter pedestal from the heat sink by decoupling the plurality of the second type of fittings from the plurality of the first type of fittings.

18. The method of claim 17, comprising:
reattaching the first adapter pedestal to the heat sink at a different mounting location by mating the plurality of the second type of fittings with a second subset of the plurality of the first type of fittings.

19. The method of claim 18, comprising:
attaching the second adapter pedestal to the heat sink by mating the plurality of the second type of fittings of the second adapter pedestal with the plurality of the first type of fittings.

20. A method comprising:
providing the system of claim 1, with the first adapter pedestal attached to the heat sink via the plurality of the second type of fittings mating with a subset of the plurality of the first type of fittings;
attaching the second adapter pedestal to the heat sink by mating the plurality of the second type of fittings of the second adapter pedestal with a second subset of the plurality of the first type of fittings; and
thermally coupling the second adapter pedestal with the second electronic component within the chassis.

* * * * *